United States Patent
Ikeuchi et al.

(10) Patent No.: US 12,390,834 B2
(45) Date of Patent: Aug. 19, 2025

(54) PIEZOELECTRIC DEVICE AND ACOUSTIC TRANSDUCER

(71) Applicant: Murata Manufacturing Co., Ltd., Nagaokakyo (JP)

(72) Inventors: Shinsuke Ikeuchi, Nagaokakyo (JP); Seiji Umezawa, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 972 days.

(21) Appl. No.: 17/507,846

(22) Filed: Oct. 22, 2021

(65) Prior Publication Data
US 2022/0040737 A1 Feb. 10, 2022

Related U.S. Application Data

(63) Continuation of application No. PCT/JP2019/051194, filed on Dec. 26, 2019.

(30) Foreign Application Priority Data

May 16, 2019 (JP) ................................. 2019-092681

(51) Int. Cl.
*B06B 1/06* (2006.01)
(52) U.S. Cl.
CPC ................... *B06B 1/0666* (2013.01)
(58) Field of Classification Search
CPC . H04R 1/02; H04R 17/00; H03H 9/02; H03H 9/17; H10N 30/20; H10N 30/30; B06B 1/0666; B06B 1/0692
See application file for complete search history.

(56) References Cited

U.S. PATENT DOCUMENTS 5,955,821 A * 9/1999 Yamamoto ............. G10K 9/122
    310/326
9,521,499 B2 * 12/2016 Theuss ................. H04R 19/005
(Continued)

FOREIGN PATENT DOCUMENTS

JP        59-69591 U     5/1984
JP    2007081614 A     3/2007
(Continued)

OTHER PUBLICATIONS

Official Communication issued in International Patent Application No. PCT/JP2019/051194, mailed on Feb. 18, 2020.
(Continued)

*Primary Examiner* — J. San Martin
(74) *Attorney, Agent, or Firm* — Keating & Bennett, LLP

(57) ABSTRACT

A piezoelectric device includes a substrate including a first main surface and a second main surface. A piezoelectric element is on the first main surface. A cover on the first main surface. The cover covers the piezoelectric element and is spaced apart from piezoelectric element on the first main surface side. The piezoelectric element includes a base portion and a membrane portion. The base portion is on the first main surface and has an annular external shape when viewed from the first main surface side. The membrane portion is inside the annular base portion when viewed from the first main surface side. The cover includes a first through hole. The substrate includes a second through hole facing the membrane portion and extends between the first main surface and the second main surface.

16 Claims, 7 Drawing Sheets

(56) References Cited

U.S. PATENT DOCUMENTS

| | | | |
|---|---|---|---|
| 2006/0158064 A1* | 7/2006 | Asakawa | H04R 1/2842 |
| | | | 310/328 |
| 2007/0047744 A1 | 3/2007 | Harney et al. | |
| 2007/0058826 A1 | 3/2007 | Sawamoto et al. | |
| 2010/0202649 A1 | 8/2010 | Inoda et al. | |
| 2010/0284553 A1* | 11/2010 | Conti | B81B 7/0061 |
| | | | 381/174 |
| 2012/0300969 A1 | 11/2012 | Tanaka et al. | |
| 2015/0264488 A1 | 9/2015 | Onishi | |
| 2017/0184718 A1 | 6/2017 | Horsley et al. | |
| 2018/0317033 A1* | 11/2018 | Zhang | B81B 3/007 |
| 2023/0283963 A1* | 9/2023 | Chen | H04R 1/04 |
| | | | 381/114 |

FOREIGN PATENT DOCUMENTS

| | | |
|---|---|---|
| JP | 2008-236556 A | 10/2008 |
| JP | 2008283312 A | 11/2008 |
| JP | 2009506658 A | 2/2009 |
| JP | 2010187076 A | 8/2010 |
| JP | 2018098546 A | 6/2018 |
| WO | 2011/093157 A1 | 8/2011 |
| WO | 2014/061584 A1 | 4/2014 |

OTHER PUBLICATIONS

First Office Action in JP2021-519305, mailed Oct. 4, 2022, 3 pages.

\* cited by examiner

PIEZOELECTRIC DEVICE AND ACOUSTIC TRANSDUCER

CROSS REFERENCE TO RELATED APPLICATIONS

This application claims the benefit of priority to Japanese Patent Application No. 2019-092681 filed on May 16, 2019 and is a Continuation Application of PCT Application No. PCT/JP2019/051194 filed on Dec. 26, 2019. The entire contents of each application are hereby incorporated herein by reference.

BACKGROUND OF THE INVENTION

1. Field of the Invention

The present invention relates to a piezoelectric device and an acoustic transducer.

2. Description of the Related Art

One of the documents of the related art that disclose configurations of piezoelectric devices is U.S. Patent Application Publication No. 2017/0184718. The piezoelectric device described in U.S. Patent Application Publication No. 2017/0184718 includes a substrate, a cover that is attached to the substrate, an ultrasonic transducer that includes a membrane portion and that is disposed on the substrate, and an integrated circuit that is disposed on the substrate and that is operatively coupled to the ultrasonic transducer. The cover surrounds the ultrasonic transducer and the integrated circuit. An acoustic cavity is formed in the substrate. The ultrasonic transducer is fixed to the substrate so as to substantially cover the acoustic cavity.

In a piezoelectric device of the related art, a through hole is formed only in a portion of a substrate that faces a membrane portion. In this piezoelectric device, acoustic waves that are generated by vibration of the membrane portion are emitted through the through hole. Alternatively, acoustic waves that reach the membrane portion through the through hole cause the membrane portion to vibrate. These acoustic waves resonate in a region extending from an open end of the through hole that is located on the side opposite to the membrane portion side to the membrane portion. This resonance can improve device characteristics of the piezoelectric device such as the sound pressure, the sensitivity, and the band of the piezoelectric device.

However, in the case of causing acoustic waves at lower frequencies to resonate in the above-described region so as to improve the device characteristics, it is necessary to further increase the distance from the open end of the substrate, the open end being located on the side opposite to the membrane portion side, to the membrane portion. When the above-described distance is increased, the thickness of the entire piezoelectric device increases.

SUMMARY OF THE INVENTION

Preferred embodiments of the present invention provide piezoelectric devices and acoustic transducers that are each able to improve device characteristics without increasing the thickness of the piezoelectric devices.

A piezoelectric device according to a preferred embodiment of the present invention includes a substrate, a piezoelectric element, and a cover. The substrate includes a first main surface and a second main surface opposite to the first main surface. The piezoelectric element is on the first main surface. The cover is on the first main surface. The cover covers the piezoelectric element and is spaced apart from the piezoelectric element on the first main surface side. The piezoelectric element includes a base portion and a membrane portion. The base portion is on the first main surface and has an annular external shape when viewed from the first main surface side. The membrane portion is located inside the annular base portion when viewed from the first main surface side. The cover includes a first through hole. The substrate includes a second through hole at a position facing the membrane portion and extending between the first main surface and the second main surface.

An acoustic transducer according to a preferred embodiment of the present invention includes a piezoelectric device, a mounting substrate, and a housing. The piezoelectric device includes a substrate, a piezoelectric element, and a cover. The substrate includes a first main surface and a second main surface opposite to the first main surface. The piezoelectric element is on the first main surface. The piezoelectric element includes a base portion and a membrane portion. The base portion is on the first main surface and has an annular external shape when viewed from the first main surface side. The membrane portion is located inside the annular base portion when viewed from the first main surface side. The cover covers the piezoelectric element and is spaced apart from the piezoelectric element on the first main surface side. The piezoelectric device is mounted on the mounting substrate such that the mounting substrate faces the second main surface. The housing accommodates the piezoelectric device and the mounting substrate. The housing includes a first wall and a second wall. The first wall is on a side opposite to the mounting substrate side with respect to the piezoelectric device. The second wall is on a side opposite to the piezoelectric device side with respect to the mounting substrate. The cover includes a first through hole. The substrate includes a second through hole at a position facing the membrane portion and extending between the first main surface and the second main surface. The mounting substrate includes a third through hole at a position facing the second through hole. The first wall includes a fourth through hole at a position facing the first through hole. The second wall includes a fifth through hole at a position facing the third through hole.

According to preferred embodiments of the present invention, device characteristics are able to be improved without increasing the thicknesses of piezoelectric devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
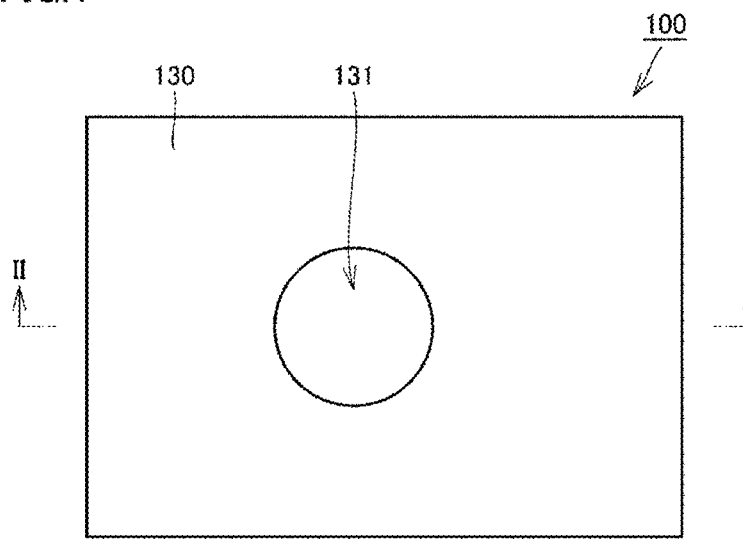
FIG. 1 is a plan view illustrating a piezoelectric device according to a first preferred embodiment of the present invention.

Piezoelectric devices and acoustic transducers according to preferred embodiments of the present invention will be described below with reference to the drawings. In the following descriptions of the preferred embodiments, portions that are the same as each other or that correspond to each other in the drawings are denoted by the same reference characters, and the descriptions thereof will not be repeated. In the present specification, the term "acoustic wave" includes "ultrasonic wave", and the term "acoustic transducer" includes "ultrasonic transducer".

First Preferred Embodiment

Figure 2:
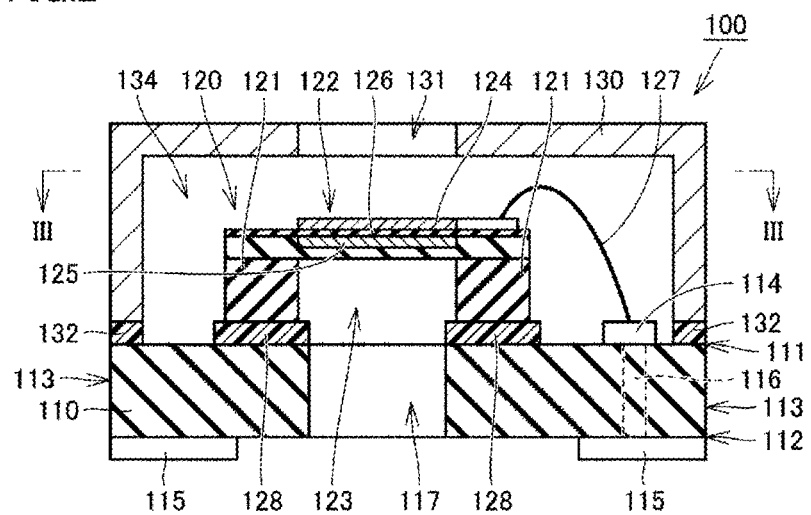
FIG. 2 is a sectional view of the piezoelectric device illustrated in FIG. 1 taken along line II-II of FIG. 1.
Figure 3:
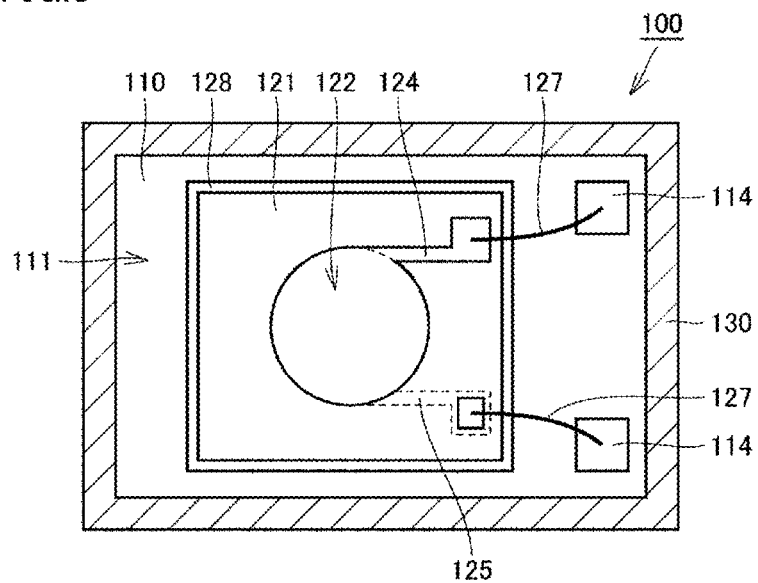
FIG. 3 is a sectional view of the piezoelectric device illustrated in FIG. 2 taken along line of FIG. 2.

A piezoelectric device according to the first preferred embodiment of the present invention will be described. FIG. 1 is a plan view illustrating a piezoelectric device according to a first preferred embodiment of the present invention. FIG. 2 is a sectional view of the piezoelectric device illustrated in FIG. 1 taken along line II-II of FIG. 1. FIG. 3 is a sectional view of the piezoelectric device illustrated in FIG. 2 taken along line III-III of FIG. 2.

As illustrated in FIG. 1 to FIG. 3, a piezoelectric device 100 includes a substrate 110, a piezoelectric element 120, and a cover 130.

As illustrated in FIG. 2, the substrate 110 includes a first main surface 111 and a second main surface 112 opposite to the first main surface 111. The substrate 110 includes a peripheral side surface 113 that connects the first main surface 111 and the second main surface 112 to each other.

A second through hole 117 that is different from a first through hole, which will be described later, is provided in the substrate 110. Details of the second through hole 117 will be described later.

As illustrated in FIG. 2 and FIG. 3, in the present preferred embodiment, the substrate 110 has a rectangular or substantially rectangular external shape when viewed from a direction normal to the first main surface 111. When viewed from the direction normal to the first main surface 111, the length of one side of the substrate 110 is, for example, about 1 mm or more and about 3 mm or less. The thickness of the substrate 110 in the direction normal to the first main surface 111 is, for example, about 0.1 mm or more and about 0.3 mm or less.

Examples of a substrate that is used as the substrate 110 include a substrate such as a glass-epoxy substrate made of a material that is a combination of a resin and glass fiber, a multilayer substrate made of a low-temperature co-fired ceramic (LTCC), and a substrate made of a ceramic material containing, for example, alumina.

A plurality of first electrodes 114 are provided on the first main surface 111 so as to be spaced apart from each other. Each of the plurality of first electrodes 114 is electrically connected to one of a plurality of electrodes (described later) of the piezoelectric element 120.

A plurality of second electrodes 115 are provided on the second main surface 112 so as to be spaced apart from one another. When the piezoelectric device 100 is mounted onto a mounting substrate, the plurality of second electrodes 115 are electrically connected to the mounting substrate. When the plurality of second electrodes 115 are connected to the mounting substrate, flow paths through which air can pass are provided between adjacent ones of the plurality of the second electrodes 115. In other words, when the piezoelectric device 100 is mounted onto the mounting substrate, the air on the second main surface 112 can flow into the space outside the peripheral side surface 113 of the substrate 110 by passing through the gaps between the adjacent second electrodes 115.

In the present preferred embodiment, the plurality of first electrodes 114 are electrically connected to some of the plurality of second electrodes 115 by via electrodes 116. The via electrodes 116 extend through the substrate 110 from the first main surface 111 to the second main surface 112.

As illustrated in FIG. 2 and FIG. 3, the piezoelectric element 120 is disposed on the first main surface 111. The piezoelectric element 120 includes a base portion 121 and a membrane portion 122.

As illustrated in FIG. 3, the base portion 121 is located on the first main surface 111, and the external shape of the base portion 121 is an annular shape when viewed from the first main surface 111. In the present preferred embodiment, when viewed from the first main surface 111, a peripheral side surface of the base portion 121 has a rectangular or substantially rectangular shape. When viewed from the first main surface 111, the peripheral side surface of the base portion 121 may have a circular or substantially circular shape or a polygonal or substantially polygonal shape, for example.

When viewed from the first main surface 111, the membrane portion 122 is located inside the annular base portion 121. The membrane portion 122 is supported by the base portion 121. Thus, as illustrated in FIG. 2, the piezoelectric element 120 includes a recess 123 that is surrounded by the base portion 121 and the membrane portion 122 on the side on which the substrate 110 is provided.

The membrane portion 122 may include a slit that extends through the membrane portion 122 in the direction normal to the first main surface 111. By providing such a slit, the membrane portion 122 may include a plurality of beam portions, at least one end of each beam portion being supported by the base portion 121.

As illustrated in FIG. 3, in the present preferred embodiment, the membrane portion 122 has a circular or substantially circular external shape when viewed in the direction normal to the first main surface 111. The diameter of the membrane portion 122 is, for example, about 0.5 mm or more and about 1.3 mm or less. When viewed in the direction normal to the first main surface 111, the membrane portion 122 may have a rectangular or substantially rectangular external shape. The thickness of the membrane portion 122 in the direction normal to the first main surface 111 is, for example, about 0.5 µm or more and about 6.0 µm or less. When viewed in the direction normal to the first main surface 111, the external shape of the membrane portion 122 may be a polygonal or substantially polygonal shape or a rectangular or substantially rectangular shape, for example.

As illustrated in FIG. 2 and FIG. 3, in the present preferred embodiment, the membrane portion 122 includes at least an upper electrode layer 124, a lower electrode layer 125, and a piezoelectric layer 126. In the direction normal to the first main surface 111, when the side on which the substrate 110 is provided with respect to the membrane portion 122 and the side opposite to the side on which the substrate 110 is provided with respect to the membrane portion 122 are respectively referred to as a lower side and an upper side, the upper electrode layer 124 is located on the upper side of the piezoelectric layer 126. The lower electrode layer 125 faces at least a portion of the upper electrode layer 124 with the piezoelectric layer 126 interposed therebetween.

As illustrated in FIG. 3, the upper electrode layer 124 and the lower electrode layer 125 are arranged so as to extend from the membrane portion 122 toward the base portion 121. The upper electrode layer 124 and the lower electrode layer 125 are electrically connected to the plurality of first electrodes 114 by wire bonding using a plurality of bonding wires 127.

In the present preferred embodiment, the membrane portion 122 is configured as described above, so that the membrane portion 122 can vibrate in the direction normal to the first main surface 111. More specifically, in ultrasonic waves in a low-frequency region of about 20 kHz or higher and about 60 kHz or lower, for example, the membrane portion 122 is configured to vibrate in the direction normal to the first main surface 111 at a mechanical resonant frequency.

As illustrated in FIG. 2, in the present preferred embodiment, the piezoelectric element 120 is bonded to the substrate 110 with a die bonding material 128 that is provided between the base portion 121 and the first main surface 111. As illustrated in FIG. 2 and FIG. 3, in the present preferred embodiment, by using the die bonding material 128, the base portion 121 is bonded to the first main surface 111 of the substrate 110 without any gap therebetween along the entire or substantially the entire periphery of the base portion 121 when viewed in the direction normal to the first main surface 111. As a result, the space on the side on which the recess 123 is provided with respect to the membrane portion 122 and the space on the side opposite to the side on which the recess 123 is provided with respect to the membrane portion 122 can be acoustically isolated from each other. In the case where a portion of the base portion 121 is bonded to the first main surface 111 of the substrate 110 with the die bonding material 128, the above-described spaces may be acoustically isolated from each other by additionally injecting the die bonding material 128 or another material into the gap between the base portion 121 and the first main surface 111 of the substrate 110.

As illustrated in FIG. 3, in the present preferred embodiment, the piezoelectric element 120 has a rectangular or substantially rectangular external shape when viewed in the direction normal to the first main surface 111. When viewed in the direction normal to the first main surface 111, the length of one side of the piezoelectric element 120 is, for example, about 0.5 mm or more and about 1.5 mm or less. The thickness of the piezoelectric element 120 in the direction normal to the first main surface 111 is, for example, about 0.2 mm or more and about 0.5 mm or less.

In the present preferred embodiment, the piezoelectric element 120 is a micro-electromechanical systems (MEMS) element. In the present preferred embodiment, the piezoelectric element 120 can emit or receive ultrasonic waves by causing the membrane portion 122 to vibrate at a relatively low resonant frequency. In the present preferred embodiment, the frequency of these ultrasonic waves is specifically about 20 kHz or higher and about 60 kHz or lower, for example.

As illustrated in FIG. 1 and FIG. 3, the cover 130 is disposed on the first main surface 111. In the present preferred embodiment, the cover 130 has an external shape that is the same or substantially the same as the external shape of the substrate 110 when viewed in the direction normal to the first main surface 111.

The cover 130 covers the piezoelectric element 120 and is spaced apart from the piezoelectric element 120 on the side on which the first main surface 111 is provided. The cover 130 is provided so as not to be in contact with the plurality of bonding wires 127.

The thickness of the cover 130 is adjusted so as to be smaller than a quarter of the wavelength of the vibration frequency of the piezoelectric element 120. The thickness of the cover 130 is, for example, about 0.1 mm or more and about 0.3 mm or less.

The cover 130 includes a first through hole 131. In the present preferred embodiment, the first through hole 131 is provided so as to enable acoustic waves to enter and exit from a resonance space (described later) through the through hole 131 and to resonate in the resonance space. As a result of the resonance of acoustic waves in the resonance space, the device characteristics of the piezoelectric device 100, such as the sound pressure, the sensitivity, and the band of the piezoelectric device 100, are improved. In the present preferred embodiment, the first through hole 131 is provided at a position facing the membrane portion 122. When viewed in the direction normal to the first main surface 111, the center of the first through hole 131 may deviate from the center of the membrane portion 122. When viewed in the direction normal to the first main surface 111, the first through hole 131 may be positioned so as not to overlap the membrane portion 122.

In the present preferred embodiment, when viewed in a direction in which the first through hole 131 extends through the cover 130 (hereinafter referred to as "extending direction"), the first through hole 131 has a circular or substantially circular external shape. When viewed in the extending direction of the first through hole 131, the external shape of the first through hole 131 may have a rectangular or substantially rectangular shape or a polygonal or substantially polygonal shape, for example.

In the present preferred embodiment, the cover 130 is made of a metal material or a resin material. The cover 130 may be formed by cutting or press-working a member made of one of the above materials or may be formed by molding, for example.

In the present preferred embodiment, the cover 130 is connected to the substrate 110 with a cover-portion adhesive 132 that is provided between the cover 130 and the first main surface 111. In the present preferred embodiment, by using the cover-portion adhesive 132, the cover 130 is bonded to the first main surface 111 without any gap therebetween along the whole outer periphery of the cover 130 when viewed in the direction normal to the first main surface 111. As a result, a resonance space 134, which is the space surrounded by the cover 130 and the piezoelectric element 120, and the space outside the piezoelectric device 100 acoustically communicate with each other substantially only through the first through hole 131.

In the present preferred embodiment, the first through hole 131 faces the membrane portion 122. Note that the position of the first through hole 131 is not particularly limited as long as the resonance space 134 and the space outside the piezoelectric device 100 acoustically communicate with each other.

In the present preferred embodiment, a length L of the first through hole 131 in the extending direction, an area S of the first through hole 131 when viewed in the extending direction, and a volume V of the resonance space 134 are set such that acoustic waves that are transmitted from and received by the piezoelectric element 120 cause Helmholtz resonance in the resonance space 134. More specifically, the length L, the area S, and the volume V are adjusted such that the value of a resonance frequency f expressed by the following formula (1) becomes close to the frequency of the acoustic waves transmitted from and received by the piezoelectric element 120. Note that c in the following formula (1) stands for acoustic velocity.

$$f = \frac{c}{2\pi}\sqrt{\frac{S}{VL}} \quad (1)$$

As described above, the length L of the first through hole 131 in the extending direction, the area S of the first through hole 131 when viewed in the extending direction, and the volume V of the resonance space 134 are set so as to cause Helmholtz resonance in the resonance space 134, such that the device characteristics of the piezoelectric device 100, such as the sound pressure, the sensitivity, and the band, can be improved. Note that, by taking into consideration the shape of the first through hole 131, the length with end correction is used as the length L.

In the piezoelectric device 100 according to the first preferred embodiment of the present invention, a voltage is applied to the plurality of second electrodes 115, so that the voltage is applied between the upper electrode layer 124 and the lower electrode layer 125, each of which is electrically connected to one of the plurality of second electrodes 115. As a result, the piezoelectric layer 126 between the upper electrode layer 124 and the lower electrode layer 125 vibrates. Vibration of the piezoelectric layer 126 causes the membrane portion 122 to vibrate, and an ultrasonic wave is generated as an acoustic wave. This ultrasonic wave resonates in the resonance space 134 such that its sound pressure is amplified and then is emitted to the external space through the first through hole 131.

In the case where the piezoelectric device 100 receives acoustic waves such as ultrasonic waves, the acoustic waves that have entered the resonance space 134 through the first through hole 131 resonate in the resonance space 134, and in a state where the sound pressure of the acoustic waves is amplified, the acoustic waves cause the membrane portion 122 to vibrate. As a result, a potential difference is generated between the upper electrode layer 124 and the lower electrode layer 125, which sandwich the driven piezoelectric layer 126 from both sides of the piezoelectric layer 126. This potential difference can be detected by the plurality of second electrodes 115, which are electrically connected to the upper electrode layer 124 and the lower electrode layer 125. In this manner, the piezoelectric device 100 according to the present preferred embodiment can receive acoustic waves.

Here, details of the second through hole 117 provided in the substrate 110 will now be described. As illustrated in FIG. 2, the second through hole 117 extends between the first main surface 111 and the second main surface 112. The second through hole 117 is provided at a position facing the membrane portion 122. As a result, the space in the recess 123 communicates with the space on the side on which the second main surface 112 of the substrate 110 is present via the second through hole 117.

If the second through hole 117 is not provided, the recess 123 is covered with the substrate 110. In the case where the recess 123 is covered with the substrate 110, when the membrane portion 122 vibrates, the air in the recess 123 acts on the membrane portion 122 as an air spring. As a result, the amount of displacement of the membrane portion 122 decreases, the resonant frequency of the membrane portion 122 becomes higher, or the frequency band of the resonant frequency becomes narrower. In the present preferred embodiment, since the second through hole 117 is provided, the probability that the air in the recess 123 will act on the membrane portion 122 as an air spring can be reduced.

Note that, in the first preferred embodiment of the present invention, the second through hole 117 has a circular or substantially circular external shape when viewed in the direction normal to the first main surface 111. The inner diameter of the second through hole 117 is, for example, about 0.1 mm or more and about 1.3 mm or less. Note that the second through hole 117 may have a rectangular or substantially rectangular external shape when viewed in the direction normal to the first main surface 111. In addition, when viewed in the direction normal to the first main surface 111, the second through hole 117 is located inside the base portion 121.

As described above, in the piezoelectric device 100 according to the first preferred embodiment of the present invention, the cover 130 includes the first through hole 131. The substrate 110 includes the second through hole 117 at a position facing the membrane portion 122 and that extends between the first main surface 111 and the second main surface 112.

With the above-described configuration, acoustic waves can resonate in the resonance space 134, and the probability that the air in the recess 123 of the piezoelectric element 120 will act on the membrane portion 122 as an air spring can be reduced. As a result, the device characteristics of the piezoelectric device 100 can be improved without increasing the thickness of the piezoelectric device 100.

Figure 4:
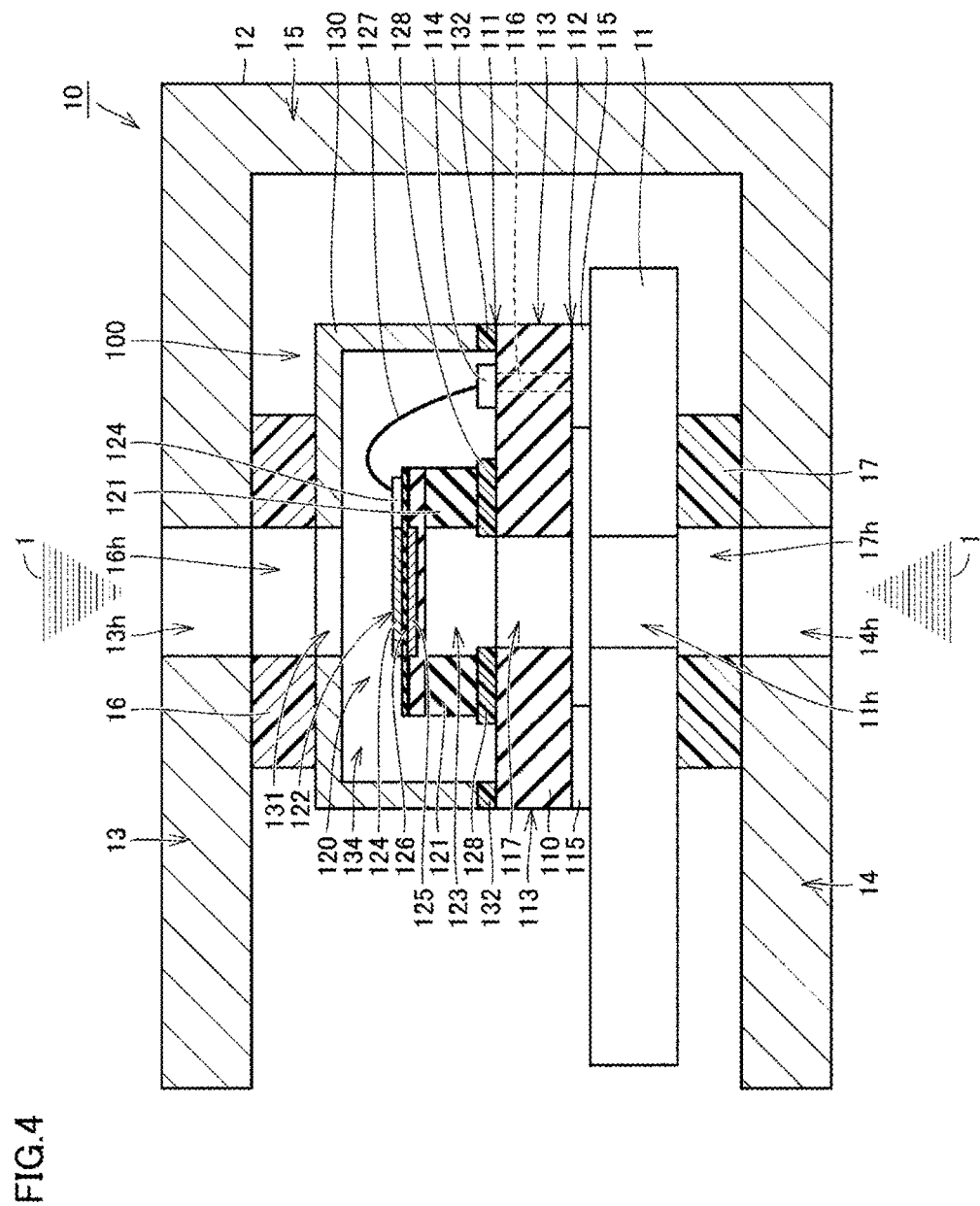
FIG. 4 is a sectional view illustrating an acoustic transducer according to the first preferred embodiment of the present invention.

Next, an acoustic transducer according to the first preferred embodiment of the present invention will be described. FIG. 4 is a sectional view illustrating the configuration of the acoustic transducer according to the first preferred embodiment of the present invention.

As illustrated in FIG. 4, an acoustic transducer 10 includes the piezoelectric device 100, a mounting substrate 11, and a housing 12.

The piezoelectric device 100 is mounted on the mounting substrate 11 such that the mounting substrate 11 faces the second main surface 112. More specifically, the plurality of second electrodes 115 on the second main surface 112 are joined to the mounting substrate 11. The plurality of second electrodes 115 are electrically connected to wiring lines (not illustrated) of the mounting substrate 11.

The mounting substrate 11 includes a third through hole 11h at a position facing the second through hole 117.

The piezoelectric device 100 and the mounting substrate 11 are accommodated in the housing 12. The housing 12 includes a first wall 13 and a second wall 14. The first wall 13 and the second wall 14 are connected to each other by a third wall 15.

The first wall 13 is located on the side opposite to the side on which the mounting substrate 11 is provided with respect to the piezoelectric device 100. The first wall 13 includes a fourth through hole 13h at a position facing the first through hole 131.

The second wall 14 is located on the side opposite to the side on which the piezoelectric device 100 is provided with respect to the mounting substrate 11. The second wall 14 includes a fifth through hole 14h at a position facing the third through hole 11h.

A first gasket 16 is disposed between the cover 130 and the first wall 13. The first gasket 16 fixes the position of the first wall 13 relative to the cover 130. The first gasket 16 is disposed such that no substantial gap is provided between a portion of the first gasket 16 that is in contact with the cover 130 and the cover 130 and such that no substantial gap is provided between a portion of the first gasket 16 that is in contact with the first wall 13 and the first wall 13. The first gasket 16 includes a sixth through hole 16h. The sixth through hole 16h is located between the first through hole 131 and the fourth through hole 13h. In other words, the first gasket 16 surrounds the first through hole 131 and the fourth through hole 13h when viewed in the direction normal to the first main surface 111.

A second gasket 17 is disposed between the mounting substrate 11 and the second wall 14. The second gasket 17 fixes the position of the second wall 14 relative to the mounting substrate 11. The second gasket 17 is disposed such that no substantial gap is provided between a portion of the second gasket that is in contact with the mounting substrate 11 and the mounting substrate 11 and such that no substantial gap is provided between a portion of the second gasket 17 that is in contact with the second wall 14 and the second wall 14. The second gasket 17 includes a seventh through hole 17h. The second gasket 17 is located between the third through hole 11h and the fifth through hole 14h. In other words, the second gasket 17 surrounds the third through hole 11h and the fifth through hole 14h when viewed in the direction normal to the first main surface 111.

As described above, in the acoustic transducer 10 according to the first preferred embodiment of the present invention, the mounting substrate 11 includes the third through hole 11h at the position facing the second through hole 117. The first wall 13 includes the fourth through hole 13h at the position facing the first through hole 131. The second wall 14 includes the fifth through hole 14h at the position facing the third through hole 11h.

As a result, the piezoelectric device 100 can transmit and receive an acoustic wave 1 on both the side on which the first through hole 131 is provided and the side on which the second through hole 117 is provided. Consequently, compared with an acoustic transducer that performs transmission and reception of acoustic waves on only one side, the angle at which the acoustic transducer 10 according to the present preferred embodiment is capable of transmitting and receiving acoustic waves can be widened.

Second Preferred Embodiment

A piezoelectric device according to a second preferred embodiment of the present invention will be described below. A main difference between the piezoelectric device according to the second preferred embodiment of the present invention and the piezoelectric device according to the first preferred embodiment of the present invention is the design of a second through hole. Thus, the descriptions of components that are the same as or similar to those of the piezoelectric device 100 according to the first preferred embodiment of the present invention will not be repeated.

Figure 5:
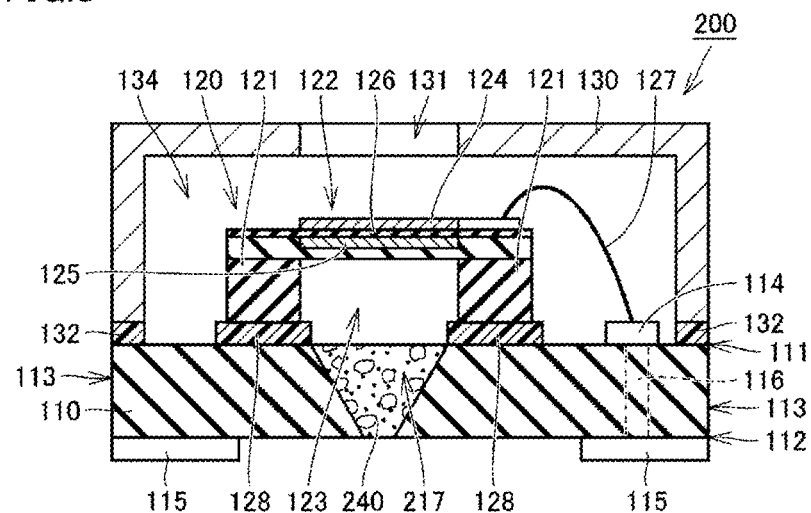
FIG. 5 is a sectional view illustrating a piezoelectric device according to a second preferred embodiment of the present invention.

FIG. 5 is a sectional view illustrating the piezoelectric device according to the second preferred embodiment of the present invention. FIG. 5 illustrates the same cross section as in FIG. 2.

As illustrated in FIG. 5, in a piezoelectric device 200 according to the second preferred embodiment of the present invention, a second through hole 217 is provided such that its hole diameter decreases from the side on which the first main surface 111 is provided toward the side on which the second main surface 112 is provided. As a result, as in the first preferred embodiment of the present invention, deterioration of device characteristics can be reduced or prevented by the second through hole 217, and in the case of transmitting acoustic waves only from the side on which the first through hole 131 is provided, the probability that an unnecessary acoustic wave will be emitted to the outside the piezoelectric device 200 through the second through hole 217 can be reduced. Accordingly, the probability that an acoustic wave that is emitted from the side on which the second through hole 217 is provided will interfere with an acoustic wave that is transmitted from the side on which the first through hole 131 is provided can be reduced.

In the piezoelectric device 200 according to the second preferred embodiment of the present invention, a porous material 240 is injected into at least a portion of the first through hole 131 or at least a portion of the second through hole 217. As a result, in the case of performing transmission and reception of acoustic waves on only one of the side on which the first through hole 131 is provided and the side on which the second through hole 217 is provided, an unnecessary acoustic wave can be absorbed on the side on which the transmission and reception of acoustic waves are not performed. Accordingly, the probability that the above-described unnecessary acoustic wave will pass through the second through hole 217 and will interfere with acoustic waves that are transmitted from and received by the piezoelectric device 200 can be reduced.

In the present preferred embodiment, the porous material 240 is injected into the second through hole 217. In addition, in the present preferred embodiment, the second through hole 217 is filled with the porous material 240. In the case where the second through hole 217 is filled with the porous material 240, it is preferable that the porous material 240 include open cells.

Third Preferred Embodiment

A piezoelectric device according to a third preferred embodiment of the present invention and an acoustic transducer according to the third preferred embodiment of the present invention will be described below. A main difference between the piezoelectric device according to the third preferred embodiment of the present invention and the piezoelectric device 100 according to the first preferred embodiment of the present invention is the design of a second through hole. A main difference between the acoustic transducer according to the third preferred embodiment of the present invention and the acoustic transducer 10 according to the first preferred embodiment of the present invention is the structure of a mounting substrate. Thus, the descriptions of components that are the same as or similar to those of the piezoelectric device 100 and the acoustic transducer 10 according to the first preferred embodiment of the present invention will not be repeated.

Figure 6:
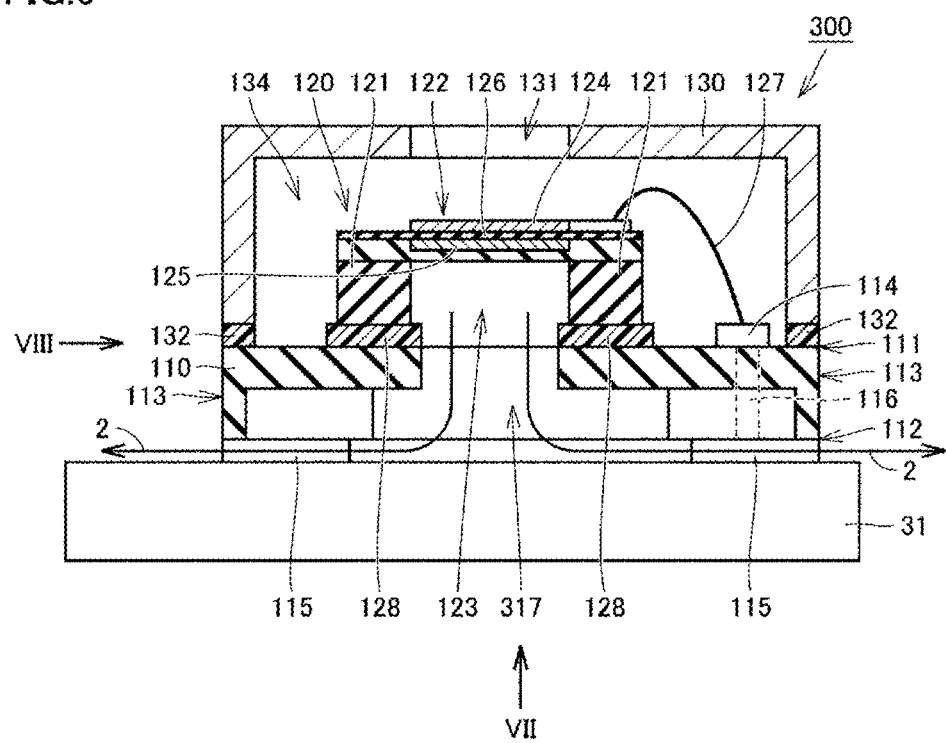
FIG. 6 is a sectional view illustrating a portion of a piezoelectric device according to a third preferred embodiment of the present invention and a portion of an acoustic transducer according to the third preferred embodiment of the present invention.
Figure 7:
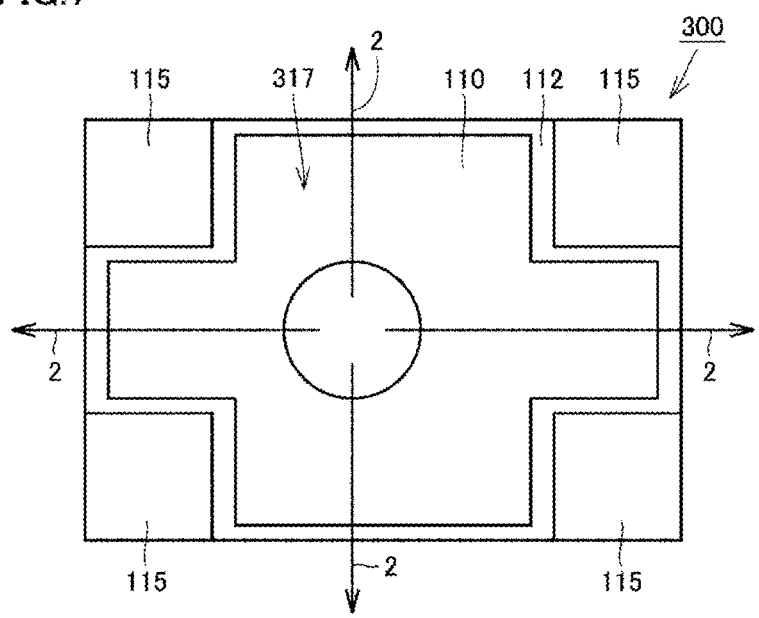
FIG. 7 is a diagram illustrating the piezoelectric device illustrated in FIG. 6 when viewed in the direction of arrow VII.
Figure 8:
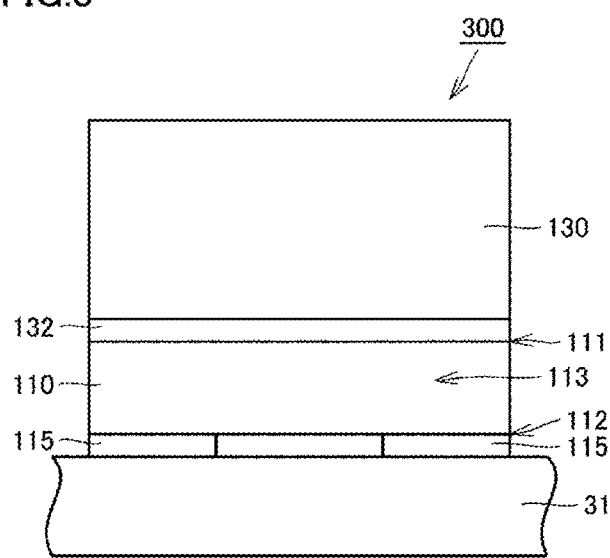
FIG. 8 is a diagram illustrating the portion of the piezoelectric device and the portion of the acoustic transducer, which are illustrated in FIG. 6, when viewed in the direction of arrow VIII.

FIG. 6 is a sectional view illustrating a portion of the piezoelectric device according to the third preferred embodiment of the present invention and a portion of the acoustic transducer according to the third preferred embodiment of the present invention. FIG. 7 is a diagram illustrating the piezoelectric device illustrated in FIG. 6 when viewed in the direction of arrow VII. FIG. 8 is a diagram illustrating the portion of the piezoelectric device and the portion of the acoustic transducer, which are illustrated in FIG. 6, when viewed in the direction of arrow VIII. FIG. 6 illustrates the same cross section as in FIG. 2.

As illustrated in FIG. 6, in the acoustic transducer according to the third preferred embodiment of the present invention, a mounting substrate 31 includes no through hole. Thus, a piezoelectric device 300 according to the third preferred embodiment of the present invention is configured such that the probability that the air in the recess 123 will act on the membrane portion 122 as an air spring can be further reduced by the shape of a second through hole 317.

More specifically, in the piezoelectric device 300 according to the third preferred embodiment of the present invention, the hole diameter of the second through hole 317 on the side on which the second main surface 112 is provided is larger than the hole diameter of the second through hole 317 on the side on which the first main surface 111 is provided. This makes it difficult for the recess 123 to act as an air spring together with the second through hole 317, which is in communication with the recess 123, and thus, deterioration of the device characteristics of the piezoelectric device 300 can be further reduced or prevented.

As illustrated in FIG. 6 to FIG. 8, in the acoustic transducer according to the third preferred embodiment of the present invention, the second main surface 112 and the mounting substrate 31 are not in direct contact with each other, and the plurality of second electrodes 115 on the second main surface 112 are spaced apart from one another. Thus, a space that is defined by the recess 123 and the second through hole 317 communicates with the space on the side on which peripheral side surface 113 of the piezoelectric device 300 is provided via the gaps between the plurality of second electrodes 115. Each of the plurality of second electrodes 115 has a relatively small thickness. As a result, in the acoustic transducer according to the third preferred embodiment of the present invention, air flow paths 2 are provided between the plurality of second electrodes 115 on the side on which the second through hole 317 is provided, and emission of unnecessary ultrasonic waves is reduced or prevented.

Fourth Preferred Embodiment

A piezoelectric device according to a fourth preferred embodiment of the present invention will be described below. A difference between the piezoelectric device according to the fourth preferred embodiment of the present invention and the piezoelectric device according to the third preferred embodiment of the present invention is the structure of a substrate. Thus, the descriptions of components that are the same as or similar to those of the piezoelectric device 300 according to the third preferred embodiment of the present invention will not be repeated.

Figure 9:
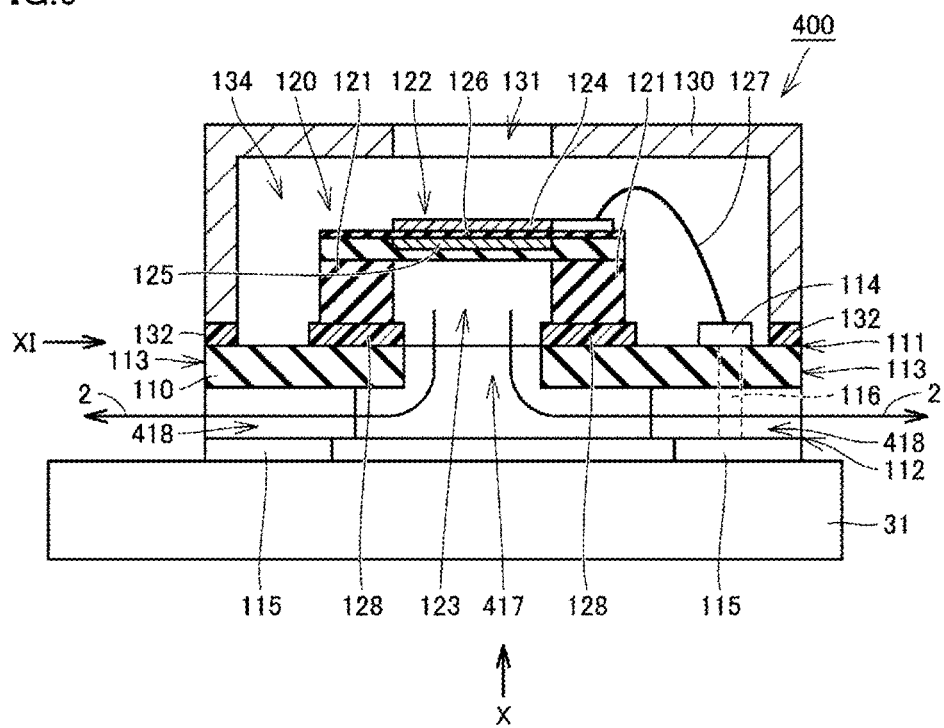
FIG. 9 is a sectional view illustrating a portion of a piezoelectric device according to a fourth preferred embodiment of the present invention and a portion of an acoustic transducer according to the fourth preferred embodiment of the present invention.
Figure 10:
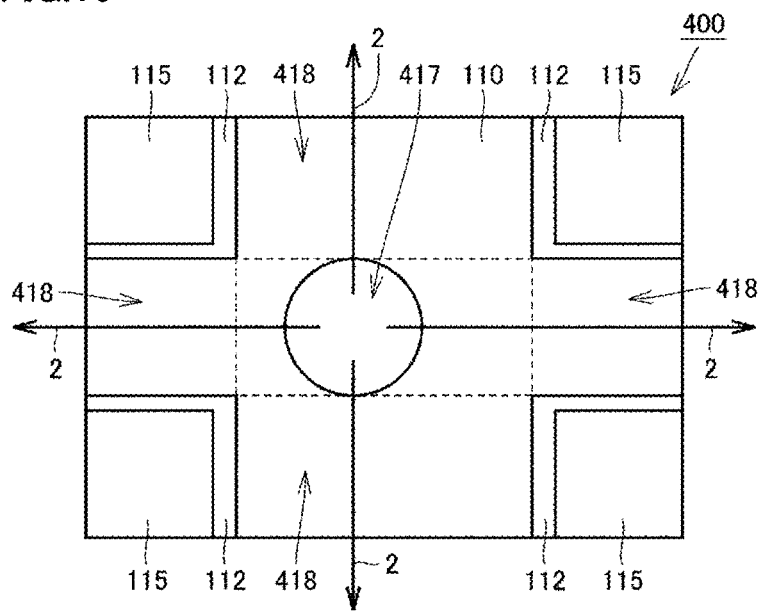
FIG. 10 is a diagram illustrating the piezoelectric device illustrated in FIG. 9 when viewed in the direction of arrow X.
Figure 11:
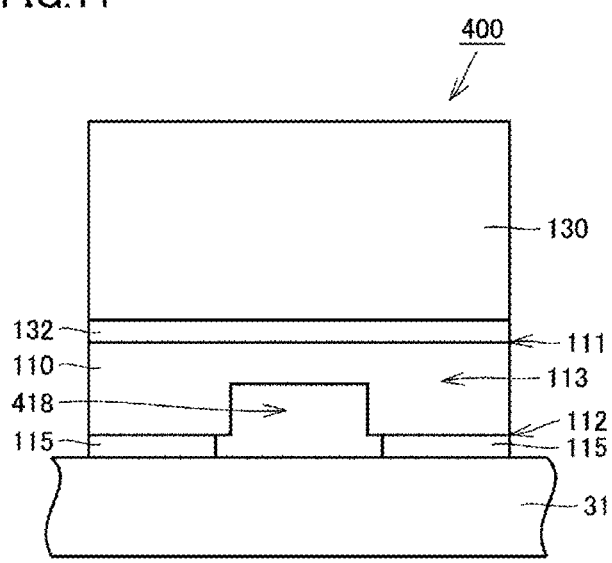
FIG. 11 is a diagram illustrating the piezoelectric device and the acoustic transducer, which are illustrated in FIG. 9, when viewed in the direction of arrow XI.

FIG. 9 is a sectional view illustrating a portion of the piezoelectric device according to the fourth preferred embodiment of the present invention and a portion of an acoustic transducer according to the fourth preferred embodiment of the present invention. FIG. 10 is a diagram illustrating the piezoelectric device illustrated in FIG. 9 when viewed in the direction of arrow X. FIG. 11 is a diagram illustrating the piezoelectric device and the acoustic transducer, which are illustrated in FIG. 9, when viewed in the direction of arrow XI. FIG. 9 illustrates the same cross section as in FIG. 6.

As illustrated in FIG. 9 to FIG. 11, in the fourth preferred embodiment of the present invention, the substrate 110 includes communication portions 418 that extend from the peripheral side surface 113 so as to communicate with a second through hole 417. In other words, the second through hole 417 and the communication portions 418 allow communication between the space inside the recess 123 and the space outside a piezoelectric device 400, so that the air flow paths 2 are provided. As a result, the probability that the air in the recess 123 of the piezoelectric element 120 will act on the membrane portion 122 as an air spring can be further reduced. Accordingly, deterioration of the device characteristics of the piezoelectric device 400 can be further reduced or prevented.

In the fourth preferred embodiment of the present invention, the substrate 110 includes the plurality of communication portions 418. When the substrate 110 is viewed from the second main surface 112, the plurality of communication portions 418 are positioned between adjacent ones of the plurality of second electrodes 115 at the four corners.

In the above-described preferred embodiments, the configurations that can be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a substrate including a first main surface and a second main surface opposite to the first main surface;
a piezoelectric element on the first main surface; and
a cover on the first main surface, covering the piezoelectric element, and being spaced apart from the piezoelectric element on the first main surface side; wherein
the piezoelectric element includes a base portion on the first main surface and having an annular external shape when viewed from the first main surface side and a membrane portion inside the annular base portion when viewed from the first main surface side;
the cover includes a first through hole;
the substrate includes a second through hole facing the membrane portion and extending between the first main surface and the second main surface;
a hole diameter of the second through hole on the second main surface side is larger than a hole diameter of the second through hole on the first main surface side; and
a porous material is provided at least at a portion of the first through hole or at a portion of the second through hole.

2. The piezoelectric device according to claim 1, wherein a thickness of the substrate is about 0.1 mm or more and about 0.3 mm or less.

3. The piezoelectric device according to claim 1, wherein
a plurality of first electrodes are provided on the first main surface so as to be spaced apart from each other; and
a plurality of second electrodes are provided on the second main surface so as to be spaced apart from each other.

4. The piezoelectric device according to claim 3, wherein at least one of the plurality of first electrodes is electrically connected to a corresponding one of the plurality of second electrodes by a via electrodes.

5. The piezoelectric device according to claim 1, wherein
the membrane portion has a circular or substantially circular shape; and
a diameter of the membrane portion is about 0.5 mm or more and about 1.3 mm or less.

6. A piezoelectric device comprising:
a substrate including a first main surface and a second main surface opposite to the first main surface;
a piezoelectric element on the first main surface; and
a cover on the first main surface, covering the piezoelectric element, and being spaced apart from the piezoelectric element on the first main surface side; wherein
the piezoelectric element includes a base portion on the first main surface and having an annular external shape when viewed from the first main surface side and a membrane portion inside the annular base portion when viewed from the first main surface side;
the cover includes a first through hole;
the substrate includes a second through hole facing the membrane portion and extending between the first main surface and the second main surface;
the substrate includes a peripheral side surface connecting the first main surface and the second main surface to each other; and
the substrate includes a communication portion extending from the peripheral side surface so as to communicate with the second through hole.

7. An acoustic transducer comprising:
a piezoelectric device including a substrate including a first main surface and a second main surface opposite to the first main surface, a piezoelectric element on the first main surface, and a cover on the first main surface, covering the piezoelectric element, and being spaced apart from the piezoelectric element on the first main surface side;
a mounting substrate on which the piezoelectric device is mounted such that the mounting substrate faces the second main surface; and
a housing accommodating the piezoelectric device and the mounting substrate and including a first wall and a second wall, the first wall being located on a side opposite to the mounting substrate side with respect to the piezoelectric device, and the second wall being located on a side opposite to the piezoelectric device side with respect to the mounting substrate; wherein
the piezoelectric element includes a base portion on the first main surface and having an annular external shape when viewed from the first main surface side and a membrane portion inside the annular base portion when viewed from the first main surface side;
the cover includes a first through hole;
the substrate includes a second through hole facing the membrane portion and extending between the first main surface and the second main surface;
the mounting substrate includes a third through hole facing the second through hole;
the first wall includes a fourth through hole facing the first through hole; and
the second wall includes a fifth through hole facing the third through hole.

8. The acoustic transducer according to claim 7, wherein the second through hole has a hole diameter that decreases from the first main surface side towards the second main surface side.

9. The acoustic transducer according to claim 7, wherein a hole diameter of the second through hole on the second main surface side is larger than a hole diameter of the second through hole on the first main surface side.

10. The acoustic transducer according to claim 7, wherein
the substrate includes a peripheral side surface connecting the first main surface and the second main surface to each other; and
the substrate includes a communication portion extending from the peripheral side surface so as to communicate with the second through hole.

11. The acoustic transducer according to claim 7, wherein a porous material is provided at least at a portion of the first through hole or at a portion of the second through hole.

12. The acoustic transducer according to claim 7, wherein a thickness of the substrate is about 0.1 mm or more and about 0.3 mm or less.

13. The acoustic transducer according to claim 7, wherein
a plurality of first electrodes are provided on the first main surface so as to be spaced apart from each other; and
a plurality of second electrodes are provided on the second main surface so as to be spaced apart from each other.

14. The acoustic transducer according to claim 13, wherein the plurality of first electrodes are electrically connected to some of the plurality of second electrodes by via electrodes.

15. The acoustic transducer according to claim 7, wherein the membrane portion includes a slit extending therethrough in a direction normal to the first main surface.

16. The acoustic transducer according to claim 7, wherein
the membrane portion has a circular or substantially circular shape; and
a diameter of the membrane portion is about 0.5 mm or more and about 1.3 mm or less.

* * * * *